United States Patent [19]

Larson et al.

[11] 4,433,223

[45] Feb. 21, 1984

[54] PRESSURE-SENSITIVE ADHESIVE AND APPLICATION THEREOF

[75] Inventors: Willis A. Larson; Anthony J. Van Zeeland, both of Crystal Lake, Ill.

[73] Assignee: Oak Industries Inc., Rancho Bernardo, Calif.

[21] Appl. No.: 295,717

[22] Filed: Aug. 24, 1981
(Under 37 CFR 1.47)

[51] Int. Cl.³ .............................................. H01H 3/12
[52] U.S. Cl. ................ 200/159 B; 200/5 A; 200/292
[58] Field of Search .............. 200/159 B, 292, 5 A; 252/511

[56] References Cited

U.S. PATENT DOCUMENTS

| | | | |
|---|---|---|---|
| 3,281,624 | 7/1963 | Patchen | 252/511 |
| 3,475,213 | 10/1969 | Stow | 252/511 X |
| 3,988,551 | 10/1976 | Larson | 200/5 A |
| 4,113,981 | 9/1978 | Fujita et al. | 252/511 |
| 4,157,319 | 6/1979 | Feeney et al. | 526/340 X |
| 4,158,115 | 6/1979 | Parkinson et al. | 200/5 A |
| 4,180,711 | 12/1979 | Hirata et al. | 200/5 A |

*Primary Examiner*—John W. Shepperd
*Assistant Examiner*—Renee Kidorf
*Attorney, Agent, or Firm*—Kinzer, Plyer, Dorn & McEachran

[57] ABSTRACT

A conductive adhesive for use in membrane switch and printed circuit technologies consists essentially of a resin modified copolymer of butadiene and styrene and a conductive element. The conductive element is preferably a material such as acetylene black and is more than two percent and less than 40 percent by weight of the adhesive. The conductive adhesive may be used to secure the membrane and substrate of a membrane-type switch thereby providing a conductive path between the membrane and substrate. The adhesive may also be used to attach a membrane switch tail to an associated printed circuit board or the like, again with the conductive properties of the adhesive providing a current path as well as the conventional adhesion between the two parts.

5 Claims, 6 Drawing Figures

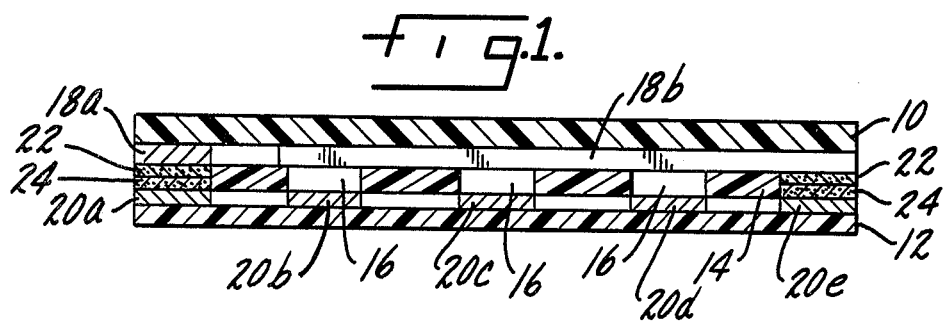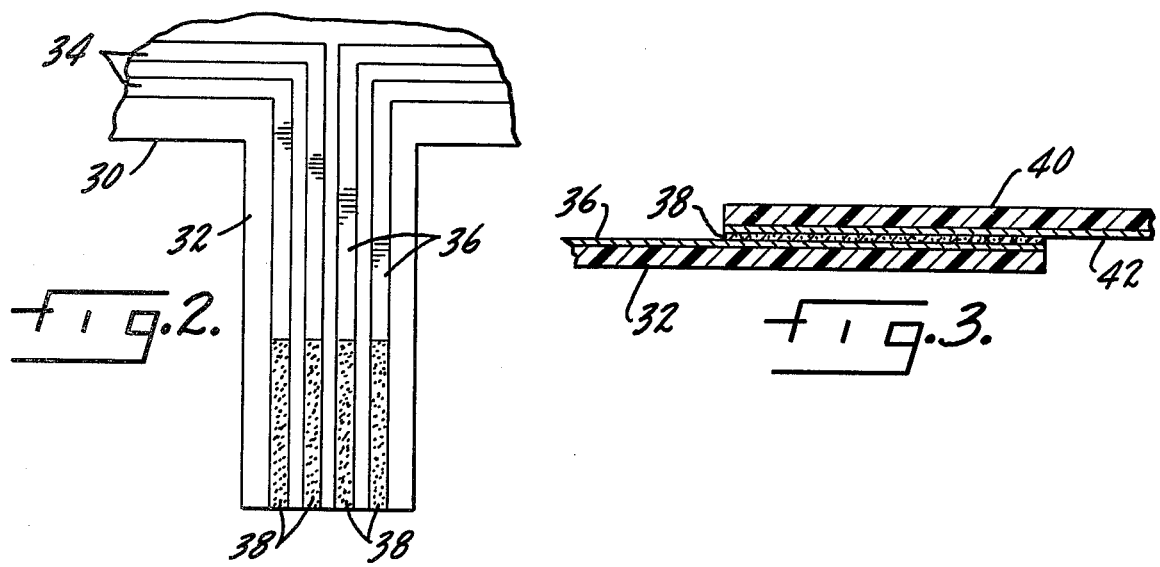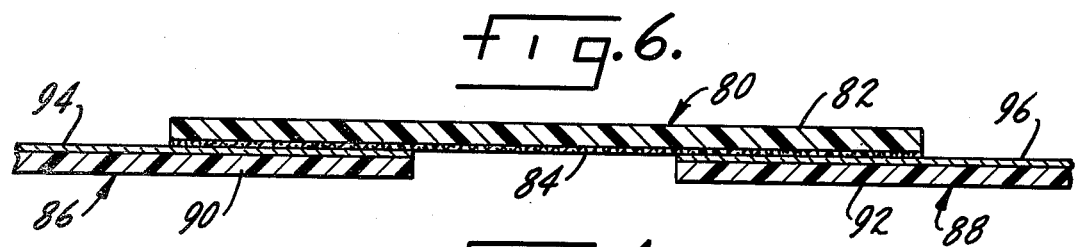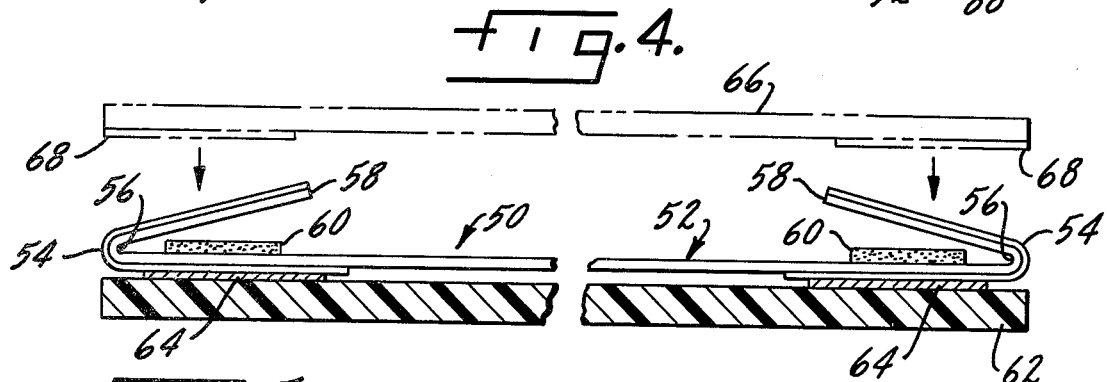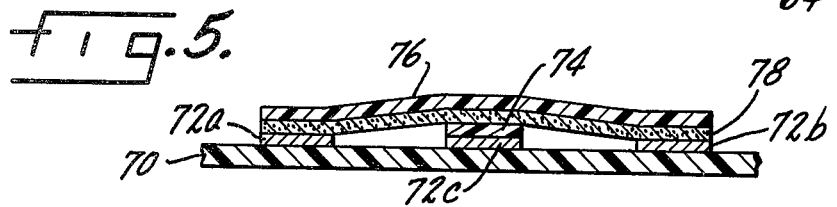

PRESSURE-SENSITIVE ADHESIVE AND APPLICATION THEREOF

SUMMARY OF THE INVENTION

The present invention relates to membrane switch and printed circuit technologies and in particular to a conductive adhesive for use therein.

The terms membrane switch technology and printed circuit technology are used in a broad sense to refer to electrical circuitry in which conductors are formed on a surface. The terms are meant to include membrane switches and printed circuits per se, as well as ancillary items such as connecting tails, interconnects, attachments for discrete components or other means for associating membrane switches and printed circuits with other parts of a system.

One purpose of the invention is a conductive adhesive for securing the membrane and substrate of a membrane type switch to not only provide the conventional adhesion between the two elements, but also to provide a conductive or current path therebetween.

Another purpose is a pressure-sensitive, conductive adhesive for use in membrane switch technology which may be utilized to attach the tail of a membrane-type switch to a printed circuit board or the like in which the adhesive provides not only the conventional adhesion properties, but also a current path between the elements.

Another purpose is a conductive adhesive for use as described in which the adhesive consists essentially of a resin modified copolymer of butadiene and styrene and a conductive element, with the conductive element being more than two percent and less than 40 percent by weight of the adhesive.

Another purpose is a pressure-sensitive, conductive adhesive for use in attaching electrical components to a printed circuit board or membrane switch panel.

Another purpose is a pressure-sensitive, conductive adhesive for use in interconnecting elements on a single-sided printed circuit board or membrane switch panel.

Another purpose is a pressure-sensitive, conductive adhesive for use in connecting one printed circuit board to another.

Another purpose is a pressure-sensitive, conductive adhesive which can be applied to a surface by silk screening.

Another purpose is a coductive adhesive of the type described in which the conductive element may be any one of acetylene black, carbon black, furnace black, graphite and silver.

Other purposes will appear in the ensuing specification, drawings and claims.

BRIEF DESCRIPTION OF THE DRAWINGS

The invention is illustrated diagrammatically in the following drawings wherein:

FIG. 1 is a side elevation of a membrane switch utilizing the adhesive disclosed herein, FIG. 2 is a top plan view of the tail portion of a membrane switch, FIG. 3 is a vertical section illustrating the attachment of the tail of FIG. 2 to an associated printed circuit board, FIG. 4 is a side elevation view of an electrical connector to which the present invention may be applied, FIG. 5 is a section through an interconnection point on a printed circuit board, and FIG. 6 is a vertical section illustrating the connection of two circuits by a paste-on tail.

DESCRIPTION OF THE PREFERRED EMBODIMENT

This invention concerns a conductive, silk-screenable, pressure-sensitive adhesive. The adhesive may be advantageously used in a variety of applications in the membrane switch, printed circuit and related arts. The adhesive consists essentially of two elements, one being the adhesive itself or that element which provides the adhesion, with the other element being a material or substance which is electrically conductive. In the case of the adhesive, a resin modified copolymer of butadiene and styrene has been found to be highly satisfactory. Specifically, the product manufactured by Morton Chemical and sold under the designation 72A106 has been found to be highly acceptable as an adhesive.

The conductive portion of the adhesive may be one of the family consisting essentially of acetylene black, carbon black, furnace black, graphite and silver, or a combination of these. These elements have varying degrees of utility with silver, because of its cost, being the least desirable. However, the conductive properties of silver are excellent. Acetylene black has been found to be a particularly satisfactory element.

The conductive element of the adhesive should be present in an amount sufficient to provide the necessary current carrying properties and it has been determined that the conductive element should be greater than two percent by weight of the combination in order to provide the necessary electrical conductivity. In like manner, if the conductive element forms too great a part of the overall combination, it detracts from the adhesive properties to a degree where the combination will not provide the necessary adherence between the elements. Accordingly, the conductive element should be less than about 40 percent by weight of the overall combination. It has been determined that an adhesive having seven percent by weight of acetylene black is highly satisfactory for the intended purpose.

The adhesive is silkscreenable and may be applied in that manner onto the surface which is to be secured to an adjoining element. The adhesive is pressure sensitive and may conventionally be covered by a release liner which is removed just prior to use.

In membrane switch technology it is conventional to secure the peripheral edges of the membrane and substrate by an adhesive. It is also conventional to have one peripheral side of the membrane and substrate connected by a fold, with the remaining sides being adhesively secured together. Traditionally, membrane switches have had a fold between the membrane and substrate when it is necessary to electrically interconnect these two elements. The present invention provides an adhesive for securing the membrane and substrate together, which adhesive has conductive properties, thereby providing a current or conductive path between the conductive traces on the membrane and substrate. With the use of a conductive adhesive as disclosed herein, the fold may be eliminated as the electrical connection between the membrane and substrate may be through the adhesive. In addition, the adhesive disclosed herein has utility as a means of attaching the tail of a membrane switch to an associated element such as a printed circuit board. Or a separate tail could be attached by the adhesive to both the membrane switch and the printed circuit board. Again, the conductive properties of the adhesive enable it to function both as an adhesive and as a current carrier.

In FIG. 1, a membrane switch includes a membrane 10 and a substrate 12. Both the membrane and substrate may be polyester, polycarbonate, or a polyvinylfluoride material or any one of the rather large number of flexible thin membrane-like materials which have been found to be satisfactory in membrane switch technology. A spacer 14 having holes 16, as conventional, is positioned between the membrane and substrate. Conductors, illustrated at 18a and 18b will be formed on the membrane and may be the conventional conductive ink or any other form of conductor which has been found to be satisfactory. In like manner, conductors 20a through 20e are formed on substrate 12. The conductors as shown form a portion of a crosspoint encoder with three switch sites illustrated at the intersection of conductor 18b with conductors 20b, 20c and 20d respectively. It will be understood, of course, that this arrangement is for illustrative purposes only. The conductors could have any desired array with the conductive adhesive of the present invention being applied as required for interconnecting conductors on the membrane and substrate.

The adhesive securing the membrane and substrate together is indicated at 22 and 24, respectively, with the layer of adhesive 22 being applied to the membrane and the layer of adhesive 24 being applied to the substrate. Thus, the adhesive may be silkscreened onto either the membrane or the sustrate or both. The membrane and substrate are formed separately and without the conventional fold connection. Those portions of the membrane and substrate conductors which are to be interconnected will extend into the areas covered by the adhesive whereby the conductive properties of the adhesive will provide a means for electrical interconnection therebetween. Thus, conductors 18a and 20a are electrically connected, as are conductors 18b and 20e. The substrate and/or membrane, after the adhesive has been applied, may be covered by a release liner and the release liners will be removed during the final assembly process. Since the adhesive can be silkscreened in application, it may be very carefully controlled as to the areas to which it is applied, thereby only providing conductive paths in the desired areas, but yet providing the necessary adhesion between the membrane and substrate to provide an excellent seal.

In FIG. 2, a portion of a substrate is indicated at 30 and has an integral tail 32 extending outwardly therefrom. Conductive traces 34 are formed on the substrate and these traces are continued as tail traces 36. This type of construction is conventional in membrane switch technology. The ends of conductive traces 36 are covered by conductive adhesive as at 38. This adhesive, after being applied in a silkscreen manner, or in any other satisfactory manner, will be covered by a release liner. The adhesive could be initially applied to a transfer sheet which is then placed on tail 32. When the transfer sheet is removed the adhesive remains on the traces 36.

When the tail is to be applied to a printed circuit board such as board 40 illustrated in FIG. 3, the release liner is removed and the tail will be pressed against the printed circuit board. In this case the printed circuit board has conductors 42 which will be in register with conductors 36 on tail 32. The adhesive applied at areas 38, which is conductive, will also provide a current or conducting path therebetween.

FIG. 4 illustrates another application of the present invention. This relates to the electrical connector described and claimed in application Ser. No. 211,827 filed Dec. 1, 1980, now abandoned, and assigned to the present assignee. Electrical connector 50 includes an insulative base member 52 formed from a generally flat sheet of plastic material. At least one conductive and adhesive strip 54 is formed at the edges of the base. The base is folded over on itself along fold lines 56 to create flaps 58. A pad 60 of resilient material is placed between the flaps and the base. The connector 50 is placed on a printed circuit board 62 which has electrical leads 64. A component 66, such as a liquid crystal display having leads 68 is placed on connector 50 for connection to circuit board 62. Since the stripes 54 are made of the conductive, pressure-sensitive adhesive of this invention, they provide both the adhesive necessary to hold the component on the printed circuit board and the electrical path between leads 64 and 68.

In another aspect, the present invention can be readily adapted for use in interconnecting conductors on a printed circuit board. It is often desired to interconnect two conductors which are separated by an intervening conductor. One way to do this is by using a double-sided board with plated-through holes. But that is an expensive solution to the problem. A more economical interconnection can be formed using the adhesive of the present invention. This is shown in FIG. 5. A printed circuit board 70 has conductors 72a and 72b with an intervening conductor 72c. It is desired to interconnect conductors 72a and 72b. An insulating cover patch 74 is placed over conductor 72c. The cover may be a piece of plastic or it may be applied in liquid form to the board. An insulative interconnect sheet 76 having a conductive, adhesive trace 78 on its underside is simply pressed into place on conductors 72a and 72b. The adhesive trace holds the interconnect sheet in place and also makes the desired electrical connection. It can be seen that many variations of the illustrated form are possible. For example, the cover patch 74 could initially be placed on adhesive trace 78. Or the insulative sheet 76 could be omitted and the adhesive trace 78 would be silkscreened onto the board. This would permit placement of a separate component on the board, to be held in place by the adhesive 78.

FIG. 6 illustrates yet another use of the conductive adhesive. A press-on connector 80 can be formed from a strip 82 of plastic film e.g. polyester. The strip 82 has adhesive, conductive traces 84 formed on it. Two separate electrical circuits, illustrated diagrammatically at 86 and 88, include substrates 90 and 92 which carry conductive elements 94 and 96. These elements are electrically connected by the traces 84. As in the applications described above, the adhesive conductor 84 provides both the adhesion required and the electrical path between the conductors. In an alternate embodiment the traces 84 could be made from regular conductive ink and separate layers of conductive adhesive could be added between conductors 84 and 94, 96. The circuits 86 and 88 could be two printed circuit boards, two membrane switches or a combination of one p.c. board and one membrane switch. In any case the connector 80 provides a fast, reliable and economical way of connecting the two elements.

The use of the conductive adhesive in membrane switches offers several advantages. The ability to make electrical connections to a separate membrane allows use of a membrane material different from the substrate material. For example, a polycarbonate membrane, with its excellent acceptance of graphics, could be used with a polyester substrate. Also, since electrical traces need not extend across a fold to connect to the membrane, much shorter trace lengths are possible. This can eliminate the need to use conductors having low sheet resistivity because the length of the conductor paths is reduced.

The present invention is not to be limited to the applications shown herein. Those skilled in the art will appreciate the many possible uses of the conductive adhesive. By way of example and not limitation, the adhesive could be used: to connect one printed circuit board to another; to make a separate paste-on tail for membrane switches (as opposed to the integral tail of FIG. 2); to attach a tail to both the membrane and substrate of a membrane switch; and to attach tails in an integrated sensing system such as that shown in application Ser. No. 225,250, filed Jan. 15, 1981, now abandoned, and assigned to the present assignee;

Whereas the preferred form of the invention has been shown and described herein, it should be realized that there may be many modifications, substitutions and alterations thereto.

The embodiments of the invention in which an exclusive property or privilege is claimed are as follows:

1. A membrane switch having a membrane and a substrate spaced therefrom, spaced electrical contacts on said membrane and substrate, and a pressure sensitive conductive adhesive securing said membrane and substrate together and providing an electrical connection therebetween.

2. The membrane switch of claim 1 further characterized in that said adhesive consists essentially of a resin modified copolymer of butadiene and styrene and a conductive element, with the conductive element being more than two percent and less than 40 percent by weight of the adhesive.

3. The membrane switch of claim 2 further characterized in that said adhesive conductive element is acetylene black.

4. The membrane switch of claim 2 further characterized in that said adhesive conductive element is on the order of about seven percent by weight of the adhesive.

5. The membrane switch of claim 2 further characterized in that said adhesive peripherally secures said membrane and substrate together.

* * * * *